(12) United States Patent
Racz et al.

(10) Patent No.: US 9,529,013 B2
(45) Date of Patent: Dec. 27, 2016

(54) CURRENT SENSOR

(71) Applicant: Melexis Technologies NV, Tessenderlo (BE)

(72) Inventors: Robert Racz, Zug (CH); Jian Chen, Heist op den Berg (BE); Mathieu Ackermann, Lausanne (CH)

(73) Assignee: Melexis Technologies NV, Tessenderlo (BE)

( * ) Notice: Subject to any disclaimer, the term of this patent is extended or adjusted under 35 U.S.C. 154(b) by 255 days.

(21) Appl. No.: 14/197,372

(22) Filed: Mar. 5, 2014

(65) Prior Publication Data

US 2014/0253103 A1 Sep. 11, 2014

(30) Foreign Application Priority Data

Mar. 8, 2013 (CH) ........................................ 562/13

(51) Int. Cl.
*G01R 1/04* (2006.01)
*G01R 15/20* (2006.01)

(52) U.S. Cl.
CPC ............. *G01R 1/0416* (2013.01); *G01R 15/20* (2013.01); *G01R 15/207* (2013.01); *H01L 2924/0002* (2013.01)

(58) Field of Classification Search
None
See application file for complete search history.

(56) References Cited

U.S. PATENT DOCUMENTS 5,942,895 A 8/1999 Popovic et al.
7,129,691 B2 10/2006 Shibahara et al.
(Continued)

FOREIGN PATENT DOCUMENTS

BE EP 2775311 A2 * 9/2014 .......... G01R 1/0416
CN 102257394 A 11/2011
(Continued)

OTHER PUBLICATIONS

Chinese Search Report for Application No. 201410082133.8 dated Mar. 7, 2014.
(Continued)

*Primary Examiner* — Jermele M Hollington
(74) *Attorney, Agent, or Firm* — McCormick, Paulding & Huber LLP

(57) ABSTRACT

A current sensor comprises a housing of plastic, a current conductor with integrally shaped first and second electrical terminals, through which a current to be measured is supplied and discharged, third electrical terminals, and a semiconductor chip having at least one magnetic field sensor, which is sensitive to a component of the magnetic field generated by the current flowing through the current conductor running perpendicularly to the surface of the semiconductor chip. The first and second electrical terminals are arranged at a first side of the housing, the third electrical terminals are arranged at a side of the housing opposite to the first side. The semiconductor chip is mounted as flip chip. The semiconductor chip comprises first bumps, which make electrical connections to the third terminals, and second bumps located above the current conductor and electrically separated from the semiconductor chip by an isolation layer.

14 Claims, 4 Drawing Sheets

(56) References Cited

U.S. PATENT DOCUMENTS

| | | | |
|---|---|---|---|
| 7,709,754 B2 * | 5/2010 | Doogue | G01R 15/207 |
| | | | 324/117 H |
| 8,222,737 B2 | 7/2012 | Watanabe et al. | |
| 8,629,539 B2 * | 1/2014 | Milano | G01R 33/0076 |
| | | | 257/676 |
| 9,176,170 B2 * | 11/2015 | Racz | G01R 15/202 |
| | | | 324/117 H |
| 9,299,915 B2 * | 3/2016 | Milano | G01R 33/0076 |
| 2005/0030018 A1 * | 2/2005 | Shibahara | G01R 15/20 |
| | | | 324/251 |
| 2006/0219436 A1 | 10/2006 | Taylor et al. | |
| 2008/0297138 A1 | 12/2008 | Taylor et al. | |
| 2010/0156394 A1 | 6/2010 | Ausserlechner et al. | |
| 2012/0081110 A1 | 4/2012 | Racz | |
| 2012/0306486 A1 * | 12/2012 | Racz | G01R 15/20 |
| | | | 324/251 |
| 2013/0020660 A1 | 1/2013 | Milano et al. | |
| 2014/0333301 A1 * | 11/2014 | Racz | G01R 19/0092 |
| | | | 324/251 |

FOREIGN PATENT DOCUMENTS

| | | | | |
|---|---|---|---|---|
| DE | 4141386 | A1 | 6/1993 | |
| DE | 102009054892 | A1 | 7/2010 | |
| DE | EP 2814168 | A1 * | 12/2014 | H02P 9/105 |
| EP | 2295993 | A1 | 3/2011 | |
| EP | 2437072 | A3 | 7/2013 | |
| JP | H02212789 | A | 8/1990 | |
| JP | H08125097 | A | 5/1996 | |
| JP | 2002286765 | A | 10/2002 | |
| JP | 2007171156 | A | 7/2007 | |
| JP | 2010225892 | A | 10/2010 | |
| JP | 4579538 | B2 | 11/2010 | |
| JP | 2011075576 | A | 4/2011 | |
| WO | 2005026749 | A1 | 3/2005 | |
| WO | 2006130393 | A1 | 12/2006 | |
| WO | 2010048037 | A2 | 4/2010 | |
| WO | 2013015976 | A1 | 1/2013 | |

OTHER PUBLICATIONS

Japanese Examination Report dated Jan. 20, 2015 for Patent Application No. 2014-042399.

\* cited by examiner

CURRENT SENSOR

PRIORITY CLAIM

Applicant hereby claims foreign priority under 35 U.S.C. §119 from Swiss Application No. 562/13 filed Mar. 8, 2013, the disclosure of which is herein incorporated by reference.

FIELD OF THE INVENTION

The invention relates to a current sensor, especially a current sensor packed in an IC housing (IC=integrated circuit), in which the current conductor leads through the housing.

BACKGROUND OF THE INVENTION

Current conductors are available in many configurations and variants. Current sensors, which detect the magnetic field generated by the current, are packed in a conventional IC housing and in which the current conductor through which the current to be measured flows is guided through the housing, are known for example from U.S. Pat. No. 7,129,691, WO 2005026749, WO 2006130393 and US 2010156394. Such current sensors contain a current conductor which is arranged as a part of the leadframe, which is used for mounting and producing the electrical terminals, and a semiconductor chip mounted on the leadframe, which chip comprises at least one magnetic field sensor and the electronics required for its operation and for the processing of its output signal.

Since the current conductor guided through the housing has a relatively small cross-section and comprises an even further reduced cross section in the region of the magnetic field sensors in order to increase the current density there and therefore the magnetic field locally, the heat produced by the power dissipation in the current conductor leads to heating of the current sensor, which produces undesirable drift fluctuations of the magnetic field sensors. The current conductor and the electronics integrated in the semiconductor chip need to be electrically insulated from each other, wherein a predetermined dielectric strength is required by the installation which is typically 2 to 4 kV.

SUMMARY OF THE INVENTION

The invention is based on the object of developing a current sensor for a relatively high nominal current and high dielectric strength, which requires a low amount of space and can be produced at low cost.

A current sensor according to the invention comprises
a housing of plastic,
a current conductor with integrally shaped first and second electrical terminals, through which a current to be measured is supplied and discharged, third electrical terminals,
a semiconductor chip having an active surface with at least one magnetic field sensor, which is sensitive to a component of the magnetic field generated by the current flowing through the current conductor running perpendicularly to the active surface of the semiconductor chip,
wherein the first and second electrical terminals are arranged at a first side of the housing and the third electrical terminals are arranged at a side of the housing opposite to the first side,
wherein the active surface of the semiconductor chip faces the current conductor and electrical connection surfaces of the semiconductor chip are connected to the third electrical terminals by first bumps, wherein second bumps are located on the current conductor or on projections of the current conductor and wherein the second bumps are electrically separated from the semiconductor chip by an isolation layer.

Preferably, the ends of the third electrical terminals situated below the semiconductor chip are substantially arranged along a line and an adjacent edge of the current conductor extends parallel to the line, so that all third electrical terminals are remote from the current conductor at approximately the same distance.

Preferably, the current conductor comprises at least two projections which extend to the edge of the housing and are exposed there.

Preferably, the isolation layer comprises a layer of organic material. The organic material may be polyimide.

Preferably, no electrically conductive structures used for the production of electrical connections are present between the surface of the bulk material of the semiconductor chip and the second bumps.

The current conductor may be covered with a ferromagnetic layer on three sides completely and on a fourth side which faces the semiconductor chip in boundary regions.

The semiconductor chip may be covered on a back side with a ferromagnetic layer.

The housing may be a QFN housing and wherein only the electrical terminals of the current sensor are exposed at the underside of the QFN housing.

Preferably, the at least one magnetic field sensor comprises two magnetic field sensors or clusters of magnetic field sensors, which are arranged at different edges of the current conductor, so that a magnetic field that is produced by the current flowing through the current conductor points in opposite directions at the location of the two magnetic field sensors.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE PREFERRED EMBODIMENTS

Figure 1:
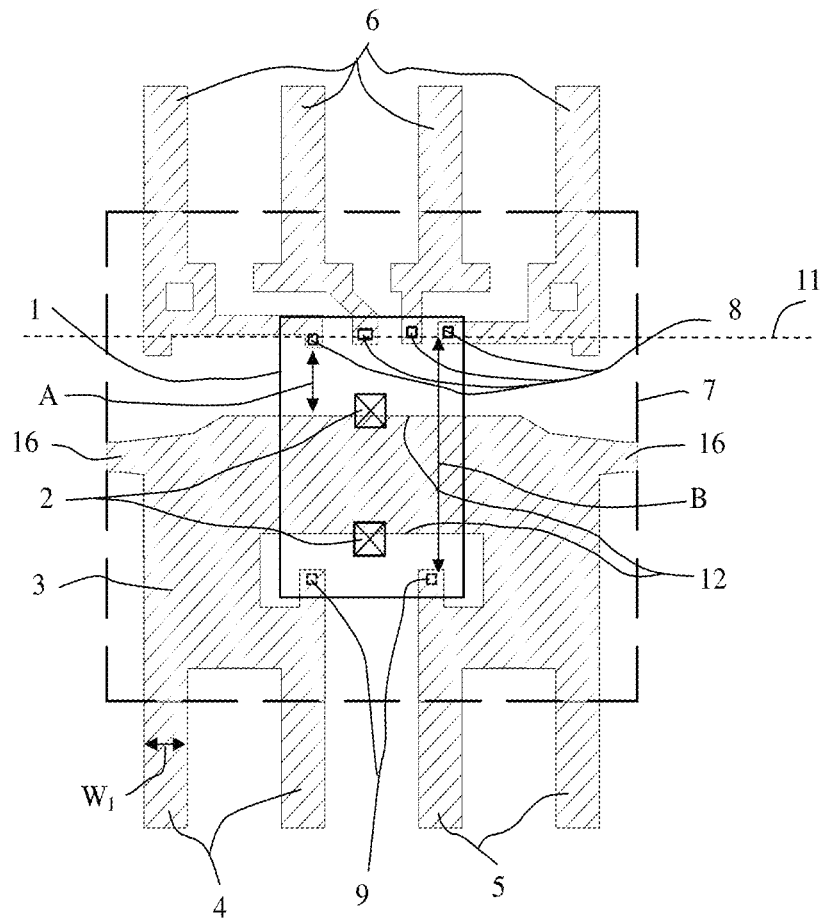
FIG. 1 shows a top view of a first embodiment of a current sensor in accordance with the invention.

FIG. 1 shows a top view of a current sensor in accordance with the invention. The current sensor comprises a semiconductor chip 1 with at least one magnetic field sensor 2 and electronic circuits for the operation of the at least one magnetic field sensor 2 and the processing of the measured signal supplied by the at least one magnetic field sensor 2. The current sensor further comprises a flat current conductor 3, whose ends are formed as integrally shaped first electrical terminals 4 and second electrical terminals 5. The current sensor further comprises third electrical terminals 6 which are used for supplying the electronic circuits with electrical power and for the output of an output signal. Their number is at least three, and four in the example. The current conductor 3 and the semiconductor chip 1 are packed in an IC housing 7, wherein the electrical terminals 4, 5 and 6 either protrude as IC leads from the housing 7 (e.g. in the case of an SOIC-8 or SOIC-16 housing), or are exposed on the bottom side and/or side walls of the housing 7 (e.g. in the case of a QFN housing). The current conductor 3 and the electrical terminals 4, 5 and 6 are parts of a so-called leadframe, which was used for the production. The electrical terminals 4 and 5 are arranged on a first side of the housing 7, the electrical terminals 6 are arranged on a second side of the housing 7 which is opposite to the first side. The semiconductor chip 1 is mounted as a flip chip, i.e. its active surface, in which the at least one magnetic field sensor 2 and the electronic circuits are integrated, faces the current conductor 3, and so-called first bumps 8 produce the electrical connections between the semiconductor chip 1 and the electrical terminals 6. Second bumps 9 are additionally arranged between the current conductor 3 and the semiconductor chip 1, which second bumps do not produce any electrical connection between the semiconductor chip 1 and the current conductor 3, but are separated from the semiconductor chip 1 by an isolation layer, as is shown in detail in FIG. 2. The isolation layer may consist of a single electrically non-conductive layer, e.g. a passivation layer, or of two or more electrically non-conductive, i.e. electrically insulating, layers lying above each other.

The current conductor 3 is substantially U-shaped, wherein the U is formed by three sections, namely a first section which comprises the first electrical terminals 4, a second elongated section with parallel edges 12, and a third section which comprises the second electrical terminals 5. In the embodiment of the current sensor in accordance with the invention as shown in FIG. 1, the current conductor 3 comprises two first electrical terminals 4 and two second electrical terminals 5 which protrude as terminal leads from the housing 7. The ends of the terminal leads of the first electrical terminals 4 which protrude from the housing 7 can be connected to each other on their part, i.e. they can be formed as so-called fused leads, as also the ends of the terminal leads of the second electrical terminals 5 which protrude from the housing 7. Preferably, two magnetic field sensors 2 or clusters of magnetic field sensors are provided, which are arranged on both sides of the middle section in the region of the edges 12 of the current conductor 3. Since the magnetic field which is produced by the current flowing through the current conductor 3 points in opposite directions at the location of the two magnetic field sensors 2, the output signals of the two magnetic field sensors 2 are subtracted from each other (differential circuit). As a result, the influence of a homogeneous external interference field can be eliminated. Each magnetic field sensor is preferably a Hall element or a cluster of Hall elements.

The first bumps 8 and the second bumps 9 are applied to the semiconductor chip 1 wherein the first bumps 8 contact electrical connection surfaces 13 (FIG. 2), while the second bumps 9 are electrically separated from the active surface of the semiconductor chip 1 by the isolation layer. During the production of the current sensor, the semiconductor chip 1 is positioned as a flip chip on the leadframe. The first bumps 8 rest on the third electrical terminals 6 and make electrical connections between the semiconductor chip 1 and the electrical terminals 6. The second bumps 9 rest on the current conductor 3. Their task is to support the semiconductor chip 1, so that the active surface of the semiconductor chip 1 is aligned parallel to the surface of the current conductor 3 and also remains so during the packing in the housing 7, which occurs by casting in a mould. The isolation layer ensures that the second bumps 9 and therefore also the current conductor 3 are electrically separated from the semiconductor chip 1.

The current sensor in accordance with the invention is designed such that a high dielectric strength on the one hand and the highest possible nominal current on the other hand are achieved in combination with a predetermined standard IC housing. Both goals are achieved in such a way that the ends of the third electrical terminals 6 situated below the flip chip are substantially arranged along a line 11, which extends parallel to the adjacent edge 12 of the middle section of the current conductor 3, so that all third electrical terminals 6 are remote from the current conductor 3 at approximately the same distance A. The distance A is dimensioned to such an extent that the required dielectric strength is provided. The arrangement of the third electrical terminals 6 along the line 11 ensures that the current conductor 3 can largely fill the area that is in total available within the housing 7, apart from recesses and/or holes in the current conductor 3 which are required for preventing a delamination of the current conductor 3 and the housing 7. In other words, the current conductor 3 has anywhere a relatively large width, which reduces its electrical resistance to a minimal possible value and thus ensures minimising the power dissipation at predetermined housing dimensions on the one hand and efficiently dissipating the produced heat to the ambient environment on the other hand.

The first bumps 8 and the second bumps 9 are situated apart from each other at a distance B. They are preferably arranged close to the opposite edges of the semiconductor chip 1, so that the distance B is at a maximum. The distance B can also be smaller. The support function of the second bumps 9 is usually fulfilled when B>A, since in this case the distance A is typically at least one-quarter to one-third of the side length of the semiconductor chip 1. Preferably, two second bumps 9 are present. It is also possible to provide only one single second bump 9, which must then be arranged approximately on the central axis of the semiconductor chip 1.

With the exception of the exposed connection surfaces 13, the active surface of the semiconductor chip 1 is covered by a passivation layer 14, which consists of silicon dioxide or silicon nitride for example. The passivation layer 14 is electrically non-conductive. A further electrically non-conductive layer 15 is applied to the relatively thin passivation layer 14, whose thickness is dimensioned in such a way that the dielectric strength required between the current conductor 3 and the semiconductor chip 1 is achieved. An organic material is especially suitable as a material for the electrically non-conductive layer 15. Polyimide is an example of a preferred organic material. The thickness of the electrically non-conductive layer 15 typically lies in a range of 10 to 20 µm, but it can also reach higher values of 30 or even 40 µm. The passivation layer 14 and the electrically non-conductive layer 15 jointly form a two-layer isolation layer, which is shown and denoted in FIG. 2 by the reference numeral 10.

The current conductor 3 has an electrical resistance, which is why the current flowing through the current conductor 3 generates heat which needs to be dissipated to the ambient environment. In order to minimise the heat generated by the maximum permitted current, the current conductor 3 should be made as wide as possible over its entire length. On the other hand, the width of the current conductor 3 should be made as narrow as possible in the region of the at least one magnetic field sensor 2 in order to maximise the magnetic field produced by the current flowing through the current conductor 3. The thickness of the current conductor 3 is uniform, because it is predetermined by the thickness of the leadframe. The geometry of the terminal leads, i.e. especially their width $W_1$, is predetermined by standards. The width of the current conductor 3 is advantageously always wider than the predetermined width $W_1$ of the terminal leads. The current conductor 3 can be provided with additional holes or slits if required in order to exclude delamination from the housing 7.

In order to increase the mechanical stability, the current conductor 8 is optionally formed with projections 16, which are originally connected to the frame of the leadframe, but are severed at the end of the production process together with the electrical terminals 4, 5 and 6 from the frame of the leadframe. The projections 16 are therefore exposed at the edge of the housing 7. Two projections 16 are provided in the example, which are arranged in the extension of the middle section of the current conductor 3.

Figure 2:
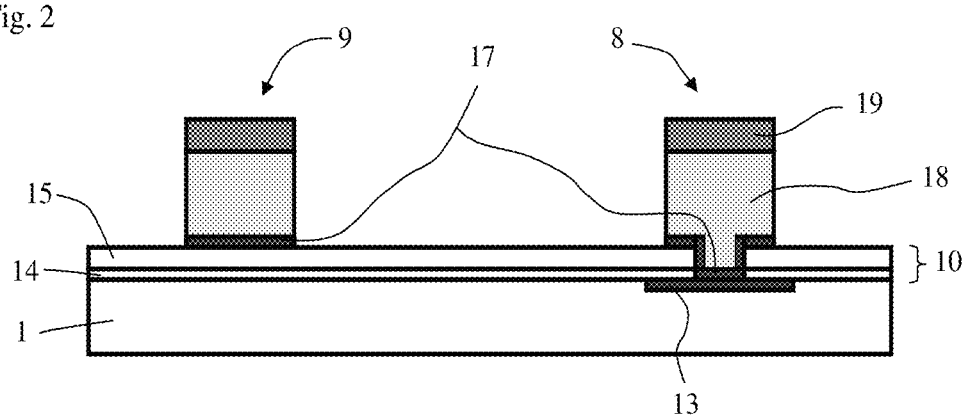
FIG. 2 shows a sectional view of a semiconductor chip with bumps.

FIG. 2 shows a sectional view of the semiconductor chip 1 with a first bump 8 and a second bump 9 in an illustration which is not true to scale. The passivation layer 14 and the further electrically non-conductive layer 15, which jointly form the isolation layer 10, cover the active surface of the semiconductor chip 1, with the exception of the locations where the first bumps 8 make contact with the electrical connection surfaces 13 of the semiconductor chip 1. The bumps 8 and 9 are produced by means of standard technology. They comprise a metal layer 17 (in the field called metal via), a copper layer 18 and a solder layer 19 for example. The bumps 8 and 9 can also be made of other materials. The metal layer 17 can also be a sequence of two or more materials, so that the metal layer 17 will bond well on the one hand and can be used on the other hand as a seed layer for electrodepositing the copper layer 18. When the flip chip is mounted on the lead frame the bumps 8 and 9 are molten and soldered with the electrical terminals 6 or the current conductor 3. The first bumps 8 make the electrical connections to the electrical connection surfaces 13 on the semiconductor chip 1, whereas the isolation layer 10 prevents an electrical connection between the current conductor 3 and the semiconductor chip 1.

Advantageously there are no electrically conductive structures between the surface of the bulk material of the semiconductor chip 1 and the second bumps 9, in order to further increase the dielectric strength. Such conductive structures are made of a metallisation layer provided for the production of the electrical connections such as for example the metallisation layer of the connection surface 13.

Figure 3:
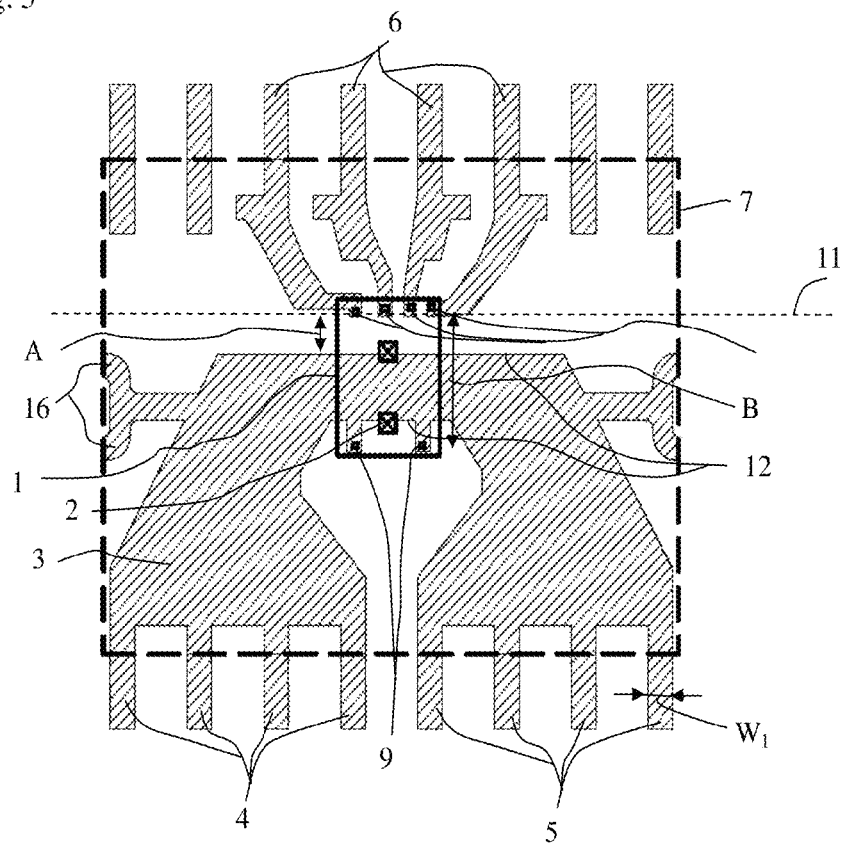
FIG. 3 shows a top view of a second embodiment of a current sensor in accordance with the invention.

FIG. 3 shows a top view of a second embodiment of a current sensor in accordance with the invention, which is designed for an SOIC-16 housing. In the first and second embodiment, the current conductor 3 comprises two projections integrally formed or integrally attached to the current conductor 3, above which the second bumps 9 are arranged. These projections allow arranging the first bumps 8 and the second bumps 9 respectively close to an edge of the semiconductor chip 1 on the one hand and to arrange the semiconductor chip 1 with respect to the longitudinal axis of the current conductor 3 in its middle section in an approximately symmetrical manner on the other hand. In combination with the middle section of the current conductor 3 which is made in a relatively wide manner, this will lead to the consequence that the current conductor 3 is a heat source with a relatively large area with respect to the semiconductor chip 1, so that no temperature gradient will be produced in the region of the magnetic field sensors 2 and the analog electronic circuits which are necessary for the operation of the magnetic field sensors 2.

Figure 4:
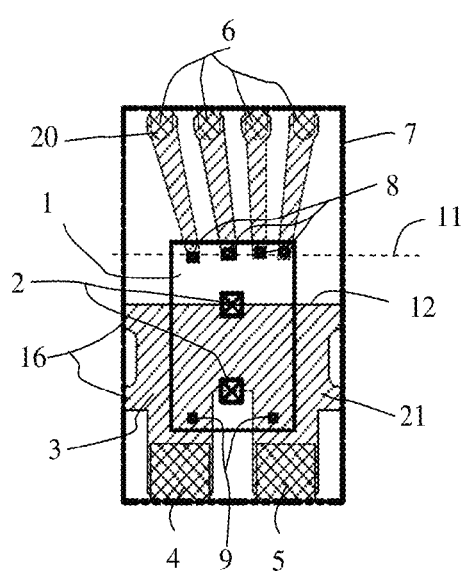
FIGS. 4 and 5 show a top view and a bottom view of a third embodiment of a current sensor in accordance with the invention.
Figure 5:
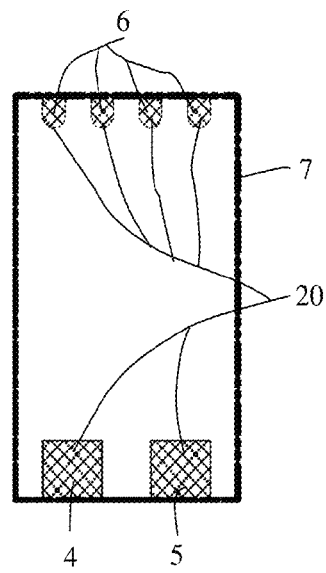

FIG. 4 shows a top view of a third embodiment of a current sensor in accordance with the invention, which is arranged and optimised for a QFN housing. FIG. 5 shows the current sensor from below, i.e. its bottom side. The leadframe contains first regions 20 of nominal thickness and second regions 21 of reduced thickness. The first regions 20 are exposed on the bottom side of the housing 7. The second regions 21 are situated in the interior of the housing 7. The first regions 20 correspond to the terminals of the current sensor, by means of which the current sensor is connected to a printed circuit board. For the purpose of increasing the mechanical stability, the current conductor 3 is also advantageously formed in this embodiment with the projections 16, which are originally connected to the frame of the leadframe, but are severed at the end of the production process together with the electrical terminals 4, 5 and 6 from the frame of the leadframe. The projections 16 are exposed at the edge of the housing 7. Two projections 16 are respectively provided in this embodiment on both sides in extension of the middle section of the current conductor 3.

Figure 6:
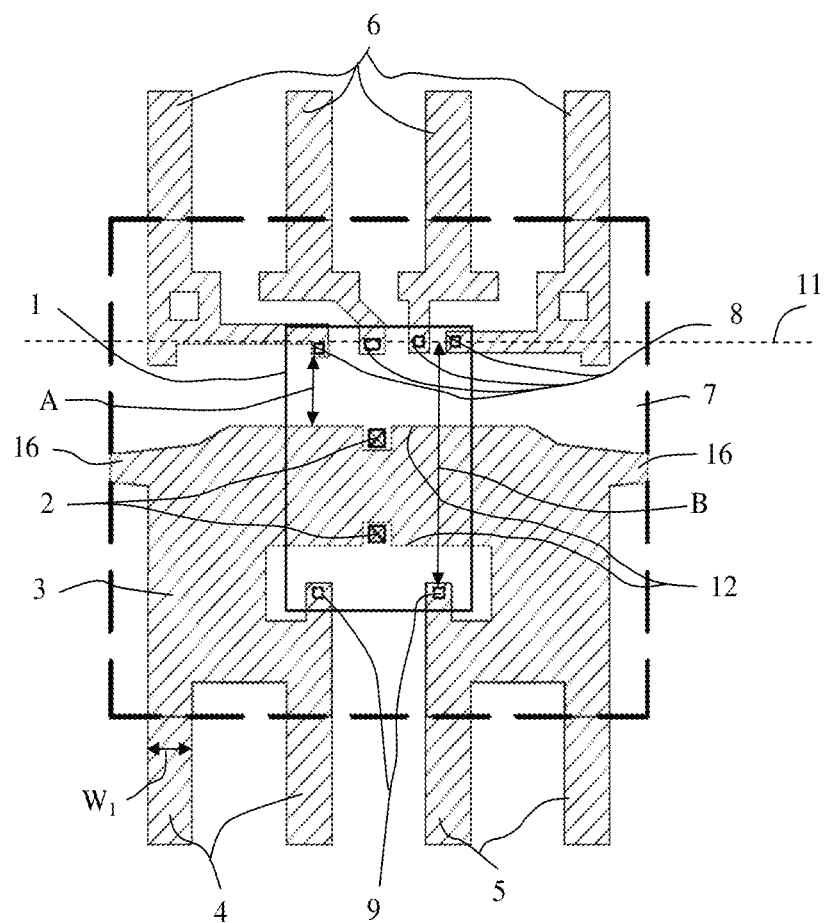
FIGS. 6 and 7 show top views of further embodiments of current sensors in accordance with the invention.
Figure 7:
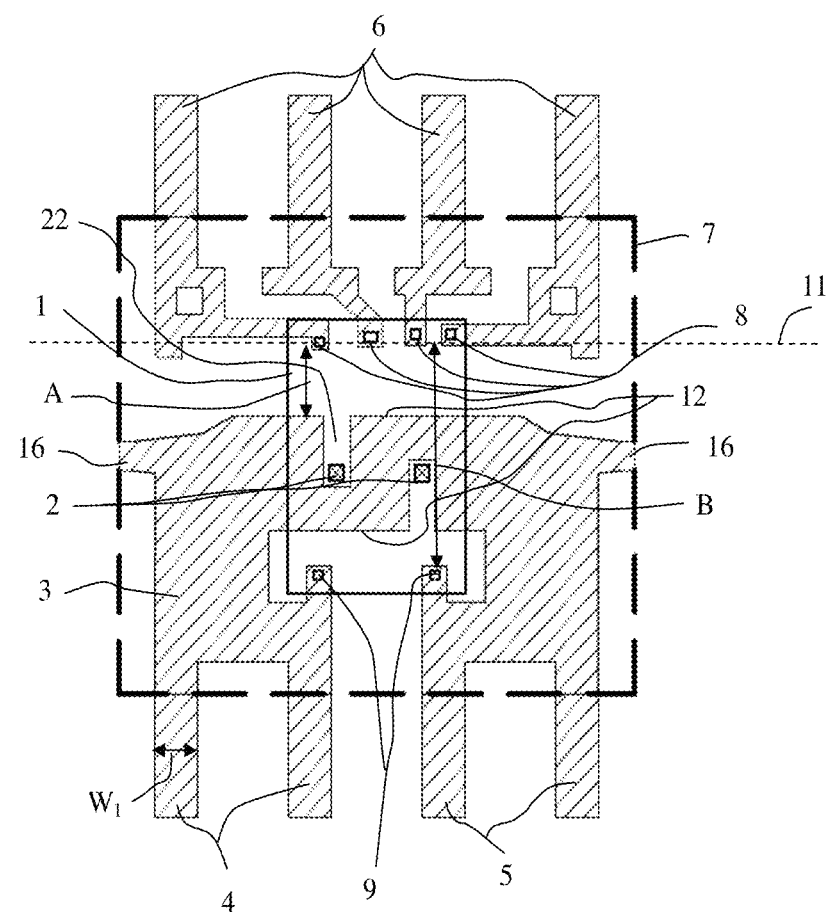

FIG. 6 shows a variant of the second embodiment, in which the middle section of the current conductor 3 is narrowed in the region of the two magnetic field sensors 2 and the distance between the two magnetic field sensors 2 is reduced. FIG. 7 shows a further variant of the current sensor of the second embodiment, in which the middle section of the current conductor 3 is formed in an S-shaped manner by two slots 22 in the region of the two magnetic field sensors 2. The slots 22 are arranged in such a way that the current conductor 3 is narrowed in the region of the two magnetic field sensors 2 and surrounds the magnetic field sensors 2 in a U-shaped way. An increase in the sensitivity at the expense of a lower nominal current is achieved in these two variants in comparison with the current sensor as shown in FIG. 4.

Figure 8:
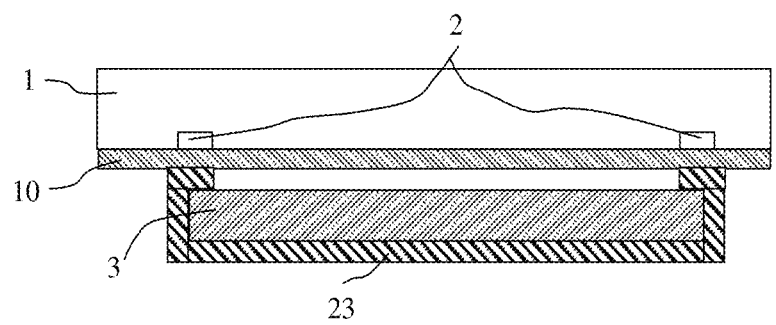
FIGS. 8 and 9 show sectional views of further embodiments of current sensors in accordance with the invention.

FIG. 8 shows a cross-sectional view (not true to scale) of an embodiment of a current sensor in accordance with the invention, in which the current conductor 3 is covered completely with a ferromagnetic layer 23 on three sides, and only in boundary regions on the fourth side which faces the semiconductor chip 1. The ferromagnetic layer 23 extends to such an extent that it covers the magnetic field sensors 2. The thickness of the ferromagnetic layer 23 is approximately 50 to 100 μm, but can also be more. It represents a magnetic yoke which amplifies the magnetic field generated by the current flowing through the current conductor 3 at the location of the magnetic field sensors 2. The ferromagnetic layer 23 is applied onto the current conductor 3 by means of electroplating for example.

Figure 9:
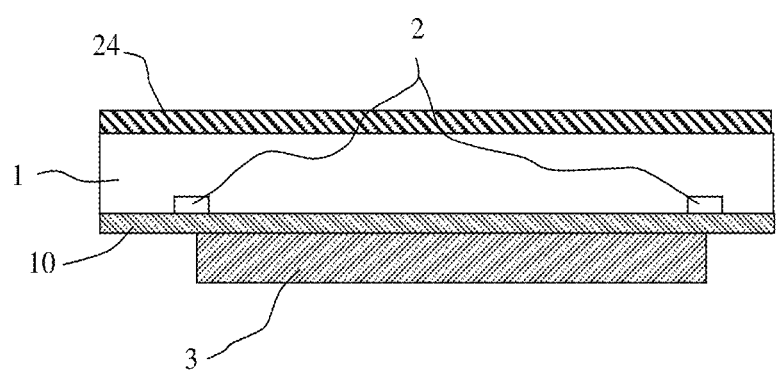

FIG. 9 shows a cross-sectional view (not true to scale) of an embodiment of a current sensor in accordance with the invention, in which a ferromagnetic layer 24 has been applied to the back side of the semiconductor chip 1. The ferromagnetic layer 24 reduces the magnetic resistance for the magnetic field generated by the current conductor 3 and amplifies the same on the one hand. On the other hand, it acts as a shielding for outer magnetic fields which extend parallel to the plane spanned by the semiconductor chip 1.

The embodiments of FIGS. 8 and 9 can also be combined, so that both ferromagnetic layers 23 and 24 are present.

The configuration of the current sensors in accordance with the invention fulfils the requirement of the standard UL 60950-1 for example.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. Current sensor, comprising
   a housing of plastic,
   a current conductor through which a current to be measured is supplied and discharged,
   a semiconductor chip having an active surface with at least one magnetic field sensor, which is sensitive to a component of a magnetic field generated by the current flowing through the current conductor running perpendicularly to the active surface of the semiconductor chip, wherein
   the current conductor has three sections forming a U-shape, namely a first section which comprises integrally shaped first electrical terminals, a second elongated section with parallel edges, and a third section which comprises integrally shaped second electrical terminals,
   the first and second electrical terminals are arranged at a first side of the housing,
   third electrical terminals are arranged at a side of the housing opposite to the first side,
   the semiconductor chip is arranged with respect to a longitudinal axis of the second section of the current conductor such that the semiconductor chip protrudes over the parallel edges of the second section of the current conductor in an approximately symmetrical manner, a first edge of the semiconductor chip projecting beyond one of the parallel edges of the second section, and a second edge of the semiconductor chip opposite the first edge projecting beyond the other of the parallel edges of the second section;
   the active surface of the semiconductor chip faces the current conductor,
   first bumps are located close to the first edge of the semiconductor chip and second bumps are located close to the second edge of the semiconductor chip,
   the first bumps are located on the third electrical terminals to provide electrical connection to electrical connection surfaces of the semiconductor chip, and
   the second bumps are located on the current conductor or on projections of the current conductor and electrically separated from the semiconductor chip by an isolation layer.

2. Current sensor according to claim 1, wherein the ends of the third electrical terminals situated below the semiconductor chip are substantially arranged along a line and wherein an adjacent edge of the current conductor extends parallel to the line, so that all third electrical terminals are remote from the current conductor at approximately the same distance.

3. Current sensor according to claim 1, wherein the current conductor comprises at least two projections which extend to the edge of the housing and are exposed there.

4. Current sensor according to claim 1, wherein the isolation layer comprises a layer of organic material.

5. Current sensor according to claim 4, wherein the organic material is polyimide.

6. Current sensor according to claim 1, wherein no electrically conductive structures used for the production of electrical connections are present between a surface of a bulk material of the semiconductor chip and the second bumps.

7. Current sensor according to claim 1, wherein the current conductor is covered with a ferromagnetic layer on three sides completely and on a fourth side which faces the semiconductor chip in boundary regions.

8. Current sensor according to claim 1, wherein the semiconductor chip is covered on a back side with a ferromagnetic layer.

9. Current sensor according to claim 1, wherein the housing is a QFN housing and only the electrical terminals of the current conductor are exposed at an underside of the QFN housing.

10. Current sensor according to claim 1, wherein the at least one magnetic field sensor comprises two magnetic field sensors or clusters of magnetic field sensors, which are arranged at different edges of the current conductor, so that a magnetic field that is produced by the current flowing through the current conductor points in opposite directions at the location of the two magnetic field sensors.

11. Current sensor according to claim 1, wherein a width of the current conductor is always wider than a width of the electrical terminals.

12. Current sensor according to claim 2, wherein a width of the current conductor is always wider than a width of the electrical terminals.

13. Current sensor according to claim 9, wherein a width of the current conductor is always wider than a width of the electrical terminals.

14. Current sensor according to claim 1, wherein the second section of the current conductor is formed in an S-shaped manner by two slots and wherein the current sensor comprises two magnetic field sensors each placed above one of the two slots.

* * * * *